(12) United States Patent
Wang

(10) Patent No.: US 12,256,507 B2
(45) Date of Patent: Mar. 18, 2025

(54) SUPPORT APPARATUS AND BENDABLE APPARATUS

(71) Applicant: BOE Technology Group Co., Ltd., Beijing (CN)

(72) Inventor: Zifeng Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 364 days.

(21) Appl. No.: 17/787,109

(22) PCT Filed: Apr. 8, 2021

(86) PCT No.: PCT/CN2021/085982
§ 371 (c)(1),
(2) Date: Jun. 17, 2022

(87) PCT Pub. No.: WO2021/238424
PCT Pub. Date: Dec. 2, 2021

(65) Prior Publication Data
US 2023/0044910 A1 Feb. 9, 2023

(30) Foreign Application Priority Data
May 28, 2020 (CN) .......... 202010469094.2

(51) Int. Cl.
*H05K 5/02* (2006.01)
*F16C 11/04* (2006.01)
(52) U.S. Cl.
CPC ............ *H05K 5/0226* (2013.01); *F16C 11/04* (2013.01)

(58) Field of Classification Search
CPC ..... H05K 5/0226; F16C 11/04; G06F 1/1652; G06F 1/1681; G09F 9/301
See application file for complete search history.

(56) References Cited

U.S. PATENT DOCUMENTS

| | | |
|---|---|---|
| 9,829,069 B2 | 11/2017 | Park et al. |
| 9,978,293 B2 | 5/2018 | Cho et al. |
| 10,599,189 B1* | 3/2020 | Hsu ............ G06F 1/1681 |
| 2008/0018631 A1 | 1/2008 | Hioki et al. |
| 2016/0224056 A1 | 8/2016 | Guo et al. |
| 2016/0353592 A1 | 12/2016 | Li et al. |
| 2016/0353594 A1 | 12/2016 | Cho et al. |
| 2017/0188470 A1 | 6/2017 | Cho et al. |

(Continued)

FOREIGN PATENT DOCUMENTS

| | | |
|---|---|---|
| CN | 2229490 Y | 6/1996 |
| CN | 103544889 A | 1/2014 |

(Continued)

OTHER PUBLICATIONS

Lenovo CN106920471A Machine Translation.*
PCT/CN2021/085982 international search report.

*Primary Examiner* — Jacob R Crum
(74) *Attorney, Agent, or Firm* — IPro, PLLC

(57) ABSTRACT

Provided is a support apparatus. The support apparatus is disposed on a back side of a bendable structure, and includes: a plurality of adjustment structures that are sequentially connected, wherein each of the plurality of adjustment structures is configured to be connected to the back side of the bendable structure, and any two adjacent adjustment structures of the plurality of adjustment structures are rotatable relative to each other.

17 Claims, 9 Drawing Sheets

(56) References Cited

U.S. PATENT DOCUMENTS

| | | | |
|---|---|---|---|
| 2017/0315401 A1 | 11/2017 | Im et al. | |
| 2018/0092223 A1* | 3/2018 | Hsu | G06F 1/1652 |
| 2018/0232008 A1 | 8/2018 | Sun | |
| 2020/0409431 A1* | 12/2020 | Fan | G06F 1/1652 |
| 2021/0191478 A1 | 6/2021 | Mehandjiysky et al. | |
| 2021/0325941 A1* | 10/2021 | Hou | G06F 1/1681 |

FOREIGN PATENT DOCUMENTS

| | | |
|---|---|---|
| CN | 104464530 A | 3/2015 |
| CN | 106061154 A | 10/2016 |
| CN | 106205389 A | 12/2016 |
| CN | 106205395 A | 12/2016 |
| CN | 206100088 U | 4/2017 |
| CN | 106920471 A | 7/2017 |
| CN | 108885846 A | 11/2018 |
| CN | 106991920 B | 8/2019 |
| CN | 209587601 U | 11/2019 |
| CN | 111462636 A | 7/2020 |

\* cited by examiner

SUPPORT APPARATUS AND BENDABLE APPARATUS

CROSS-REFERENCE TO RELATED APPLICATION

This application is a U.S. national stage of international application No. PCT/CN2021/085982, filed on Apr. 8, 2021, which claims priority to Chinese Patent Application No. 202010469094.2, filed on May 28, 2020 and entitled "SUPPORT APPARATUS AND BENDABLE APPARATUS," the contents of which are herein incorporated by references in their entireties.

TECHNICAL FIELD

The present disclosure relates to the field of mechanical technologies, and in particular, relates to a support apparatus and a bendable apparatus.

BACKGROUND

Organic light-emitting diode (OLED) display panels are bendable, and thus have been widely used in curved display devices.

SUMMARY

Embodiments of the present disclosure provide a support apparatus and a bendable apparatus, and the technical solutions are as follows.

In one aspect, a support apparatus is provided. The support apparatus is disposed on a back side of a bendable structure, and includes:
  a plurality of adjustment structures that are sequentially connected, wherein each of the plurality of adjustment structures is configured to be connected to the back side of the bendable structure, and any two adjacent adjustment structures of the plurality of adjustment structures are rotatable relative to each other.

Optionally, the any two adjacent adjustment structures are rotatable relative to each other in a plane perpendicular to the back side of the bendable structure.

Optionally, each of the adjustment structures includes a fixing member and a rotating member; wherein
  the fixing member is connected to the rotating member, and is configured to fixedly connect the rotating member to the bendable structure; and
  the rotating member is rotatably connected to the rotating member of an adjacent adjustment structure.

Optionally, the rotating member includes a body structure, and a first lug and a second lug that are disposed on two sides of the body structure respectively; wherein
  the body structure is provided with a first through hole, the fixing member being fixedly connected to the bendable structure by passing through the first through hole; and
  the first lug is rotatably connected to a second lug of the adjacent adjustment structure.

Optionally, each of the first lug and the second lug includes a first side face and a second side face that are opposite to each other; wherein the second side face is closer to the first through hole relative to the first side face, and both the first side face and the second side face are parallel to an axial direction of the first through hole; and
  the first side face of the first lug is in contact with a first side face of the second lug of the adjacent adjustment structure, or
  the second side face of the first lug is in contact with a second side face of the second lug of the adjacent adjustment structure.

Optionally, a roughness of a side, in contact with another lug, of each of the lugs is greater than a roughness threshold.

Optionally, the first lug is provided with a second through hole, and the second lug is provided with a third through hole; and each of the adjustment structures further includes a connecting member;
  wherein the connecting member is disposed in the second through hole of the first lug, and the third through hole of the second lug of the adjacent adjustment structure, and the first lug is connected to the second lug of the adjacent adjustment structure by the connecting member; and
  an extension direction of the second through hole is perpendicular to the first side face of the first lug, and an extension direction of the third through hole is perpendicular to the first side face of the second lug.

Optionally, the connecting member is a first screw; and a thread is present inside the second through hole or the third through hole;
  wherein the first screw is connected to one of the second and third through holes with the thread by passing through the other of the second and third through hole without the thread.

Optionally, the first side face of the first lug is in contact with the first side face of the second lug of the adjacent adjustment structure; and
  the first side face of the first lug is provided with a protrusive structure, and the first side face of the second lug is provided with a groove; wherein the protrusive structure in the first lug is configured to be connected to the groove of the second lug of the adjacent adjustment structure.

Optionally, the second side face of the first lug is in contact with a second side face of the second lug of the adjacent adjustment structure; and
  the second side face of the first lug is provided with a protrusive structure, and the second side face of the second lug is provided with a groove; wherein the protrusive structure in the first lug is configured to be connected to the groove of the second lug of the adjacent adjustment structure.

Optionally, the protrusive structure includes two protrusive sub-structures disposed on two sides of the second through hole respectively, and the groove includes two sub-grooves disposed on two sides of the third through hole respectively;
  wherein each of the protrusive sub-structures of the first lug is configured to be connected to one sub-groove of the second lug of the adjacent adjustment structure.

Optionally, an orthographic projection of each of the protrusive sub-structures on the first side face of the first lug is fan-shaped, and an orthographic projection of each of the sub-grooves on the first side face of the second lug is fan-shaped; wherein a first fan-shaped angle of each of the sub-grooves is greater than a second fan-shaped angle of each of the protrusive sub-structures.

Optionally, the body structure, the first lug, and the second lug are integrally formed.

Optionally, the first side face of the first lug, the first side face of the second lug, and the first side face of the body structure are coplanar.

Optionally, the first through hole is a strip-shaped through hole.

Optionally, the fixing member is a second screw; and
a ring-shaped first boss is disposed inside the first through hole; wherein a diameter of a head of the second screw is greater than the inner diameter of the first boss, and is less than an inner diameter of the first through hole.

Optionally, a distance between a first face of the first boss and a first end face of the body structure is equal to a distance between a second face of the first boss and a second end face of the body structure; and
the first face and the second face of the first boss are parallel to each other, the first end face and the second end face of the body structure are parallel to each other, and the second end face is a face connected to the back side of the bendable structure.

In the other aspect, a bendable apparatus is provided. The bendable apparatus includes a bendable structure and at least one support apparatus according to the above aspect;
wherein the support apparatus is disposed on a back side of the bendable structure, and is connected to the back side of the bendable structure.

Optionally, the bendable structure is a flexible display panel.

Optionally, the flexible display panel includes a flexible display screen and a flexible backplane; wherein
the flexible backplane is disposed on a non-display side of the flexible display screen, and is fixedly connected to the flexible display screen; and
the support apparatus is disposed on a side, distal from the flexible display screen, of the flexible backplane, and is fixedly connected to the flexible backplane.

Optionally, the bendable apparatus further includes a plurality of ring-shaped second bosses disposed on the side, distal from the flexible display screen, of the flexible backplane; wherein a thread is present inside each second boss; wherein
the fixing member in the support apparatus is in threaded connection with one of the second bosses.

Optionally, the bendable apparatus includes a plurality of support apparatuses;
wherein a plurality of adjustment structures in each of the plurality of support apparatuses are arranged along a target direction.

BRIEF DESCRIPTION OF THE DRAWINGS

For clearer description of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

Figure 1:
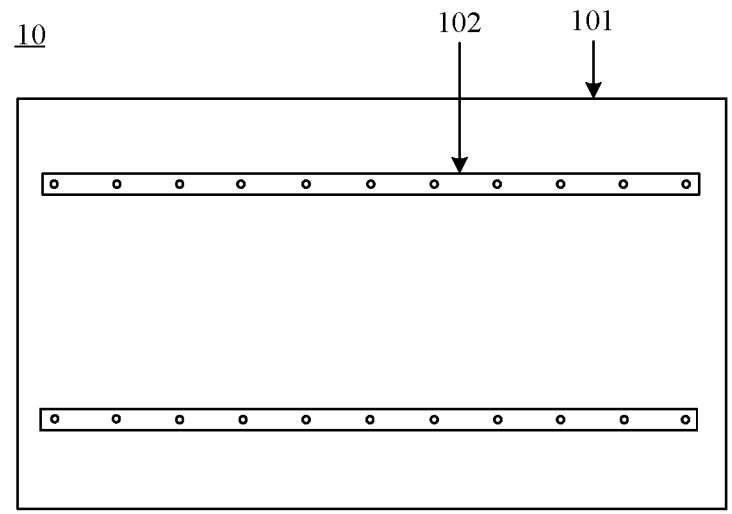
FIG. 1 is a schematic structural diagram of a bendable apparatus in the related art.

In the related art, referring to FIG. 1, a curved display apparatus 10 may include an OLED display panel 101, and a support apparatus 102 configured to support the OLED display panel 101. The support apparatus 102 may be of a curved strip-shaped structure, and has a fixed curvature. After the OLED display panel 101 is fixedly connected to the support apparatus 102, the support apparatus 102 may apply a force on the OLED display panel 101 to bend the OLED display panel. In addition, in order to acquire various OLED display panels with different curvatures, support apparatuses with different curvatures may be selected and fixedly connected to the OLED display panels, such that the display apparatus with the different curvatures can be acquired.

However, as the curvature of each support apparatus in the related art is a fixed value, the curvature of the acquired curved display apparatus is fixed, and the use flexibility is relatively poor.

Figure 2:
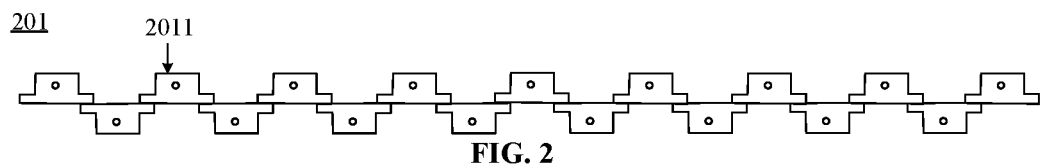
FIG. 2 is a schematic structural diagram of a support apparatus according to an embodiment of the present disclosure.

FIG. 2 is a schematic structural diagram of a support apparatus according to an embodiment of the present disclosure. The support apparatus 201 may be configured to be disposed on a back side of a bendable structure to support the bendable structure. Referring to FIG. 2, it can be seen that the support apparatus 201 may include a plurality of adjustment structures 2011 that are sequentially connected, each of the plurality of adjustment structures 2011 may be connected to the back side of the bendable structure (not shown in FIG. 1), and any two adjacent adjustment structures 2011 in the adjustment structures 2011 are rotatable relative to each other. The any two adjacent adjustment structures 2011 in the adjustment structures 2011 are rotatable relative to each other in a plane perpendicular to the back side of the bendable structure.

As the support apparatus 201 is disposed on the back side of the bendable structure, the support apparatus 201 may apply a force to the bendable structure to bend the bendable structure. For example, the curvature of the bendable structure is equal to the curvature of the support apparatus 201. In addition, as the any two adjacent adjustment structures 2011 in the support apparatus 201 are rotatable relative to each other, the curvature of the support apparatus 201 can be adjusted by adjusting a rotation angle between each adjustment structure 2011 and the adjacent adjustment structure 2011, such that the adjustment of the curvature of the bendable structure can be achieved.

In the embodiments of the present disclosure, the bendable structure may be a flexible display panel. By disposing the support apparatus 201 on the back side of the flexible display panel, the curvature of the flexible display panel can be adjusted by adjusting the curvature of the support apparatus 201, such that the curvature of the display apparatus can be adjusted. As the curvature of the display apparatus is not fixed, the use flexibility of the display apparatus is relatively great. The bendable structure may further be other bendable structure. For example, the bendable structure may be a flexible plate-like structure, which is not limited in the embodiments of the present disclosure.

In the embodiments of the present disclosure, a relative rotation angle of each two adjacent adjustment structures 2011 in the support apparatus 201 may be a fixed angle, and the curvatures of all the portions of the support apparatus may be the same. Therefore, each of the adjustment structures 2011 in the support apparatus 201 may apply the same force on the bendable structure, such that curvatures of all portions of the bendable structure can be the same.

In summary, the support apparatus is provided in the embodiments of the present disclosure, and includes the plurality of adjustment structures that are sequentially connected. Each of the plurality of adjustment structures is connected to the back side of the bendable structure, and the any two adjacent adjustment structures are rotatable relative to each other. Therefore, the curvature of the support apparatus can be adjusted by adjusting the rotation angle between each adjustment structure and the adjacent adjustment structure, and the curvature of the bendable structure connected to the support apparatus can be further adjusted, such that the use flexibility of the bendable structure is relatively great.

It is noted that the bendable structure may include the back side and a front face that are opposite to each other. By adjusting a rotation direction of each adjustment structure 2011 in the support apparatus 201, the bendable structure can be bent towards a direction proximal to the back side, or the bendable structure can be bent towards a direction proximal to the front face.

Illustratively, assuming that the bendable structure is a flexible display panel, the back side of the flexible display panel is a non-light-emitting side, and the front face of the flexible display panel is a light-emitting side. The support apparatus 201 is disposed on the back side of the flexible display panel. By adjusting the rotation of the adjustment structure 2011 in the support apparatus, the flexible display panel can be a convex display panel or a concave display panel. The middle of the light-emitting side of the convex display panel is convex, and the middle of the light-emitting side of the concave display panel is concave.

Figure 3:
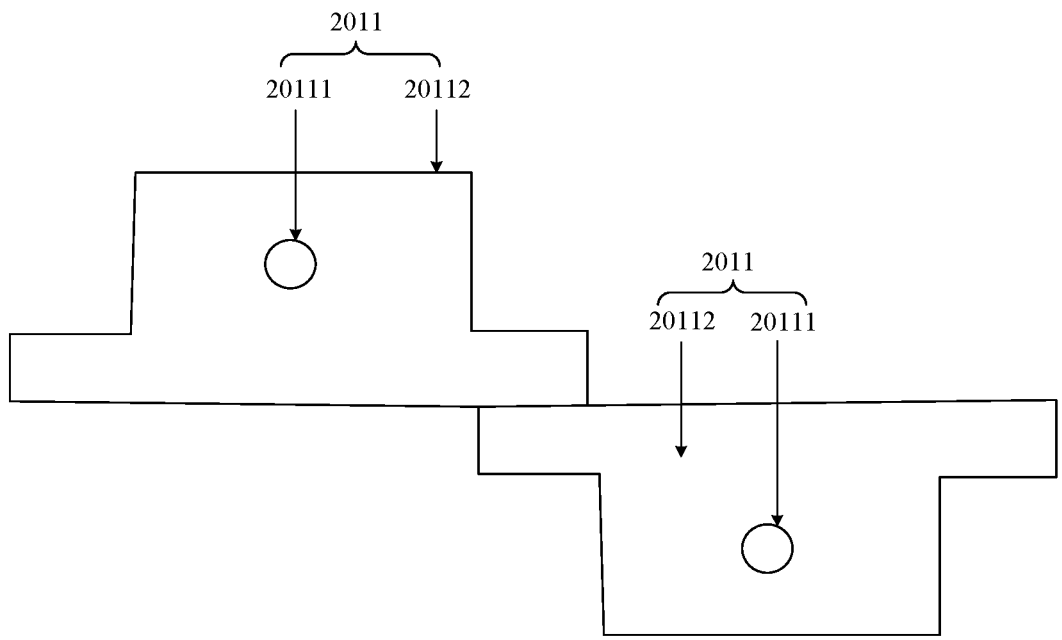
FIG. 3 is a schematic diagram of a partial structure of the support apparatus shown in FIG. 2.

FIG. 3 is a schematic diagram of a partial structure of the support apparatus shown in FIG. 2. Referring to FIG. 3, each adjustment structure 2011 may include a fixing member 20111 and a rotating member 20112. The fixing member 20111 may be connected to the rotating member 20112 to fixedly connect the rotating member 20112 to the bendable structure. In addition, the rotating member 20112 may be rotatably connected to the rotating member 20112 of the adjacent adjustment structure 2011, such that the two adjacent adjustment structures 2011 are rotatable relative to each other.

Figure 4:
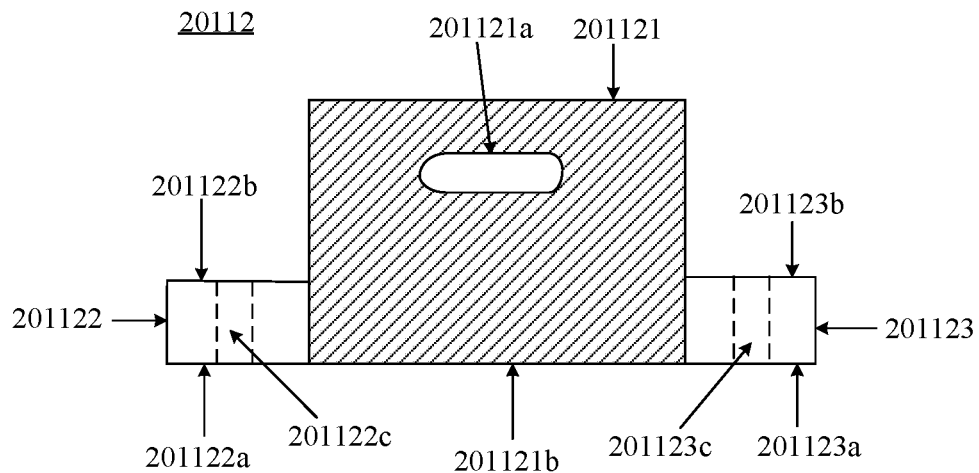
FIG. 4 is a schematic structural diagram of a rotating member according to an embodiment of the present disclosure.

FIG. 4 is a schematic structural diagram of a rotating member according to an embodiment of the present disclosure. Referring to FIG. 4, the rotating member 20112 may include a body structure 201121, and a first lug 201122 and a second lug 201123 that are disposed on two sides of the body structure 201121 respectively.

The body structure 201121 may be provided with a first through hole 201121a; and the fixing member 20111 may be fixedly connected to the bendable structure by passing through the first through hole 201121a. In addition, referring to FIG. 5, the first lug 201122 may be rotatably connected to the second lug 201123 of the adjacent adjustment structure 2011, such that the rotatable connection between the adjacent rotating members 20112 is achieved.

Referring to FIG. 4, it can also be seen that both the first lug 201122 and the second lug 201123 include a first side face and a second side face that are opposite to each other, and the second side face is closer to the first through hole 201121a relative to the first side face. Both the first side face and the second side face are parallel to an axial direction of the first through hole 201121a.

Referring to FIG. 4, for the first lug 201122, the first side face 201122a of the first lug 201122 is opposite to the second side face 201122b of the first lug 201122, and the second side face 201122b of the first lug 201122 is closer to the first through hole 201121a relative to the first side face 201122a of the first lug 201122. Both the first side face 201122a of the first lug 201122 and the second side face 201122b of the first lug 201122 are parallel to the axial direction of the first through hole 201121a. For the second lug 201123, the first side face 201123a of the second lug 201123 is opposite to the second side face 201123b of the second lug 201123, and the second side face 201123b of the second lug 201123 is closer to the first through hole 201121a relative to the first side face 201123a of the second lug 201123. Both the first side face 201123a of the second lug 201123 and the second side face 201123b of the second lug 201123 are parallel to the axial direction of the first through hole 201121a.

In the embodiments of the present disclosure, referring to FIG. 4, the first side face 201122a of the first lug 201122 and the first side face 201123a of the second lug 201123 may be coplanar, and the second side face 201122b of the first lug 201122 and the second side face 201123b of the second lug 201123 may be coplanar.

Figure 5:
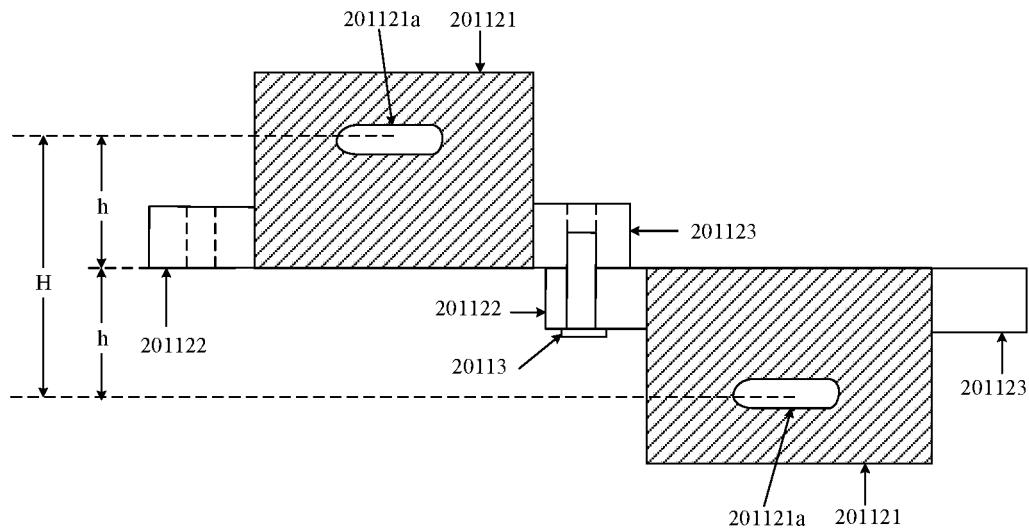
FIG. 5 is a schematic diagram of a connection relationship of adjacent adjustment structures according to an embodiment of the present disclosure.

Referring to FIG. 4, it can further be seen that the first lug 201122 may further be provided with a second through hole 201122c, and the second lug 201123 may further be provided with a third through hole 201123c. Referring to FIG. 5, each adjustment structure 2011 may further include a connecting member 20113. The connecting member 20113 may be configured to be disposed in the second through hole 201122c of the first lug 201122 and the third through hole 201123c of the second lug 201123 of the adjacent adjustment structure 2011. The first lug 201122 may be connected to the second lug 201123 of the adjacent adjustment structure 2011 by the connecting member 20113. That is, after the first lug 201122 is connected to the second lug 201123 of the adjacent adjustment structure 2011, the connecting member 20113 may be disposed in the second through hole 201122c of the first lug 201122 and the third through hole 201123c of the second lug 201123.

Figure 6:
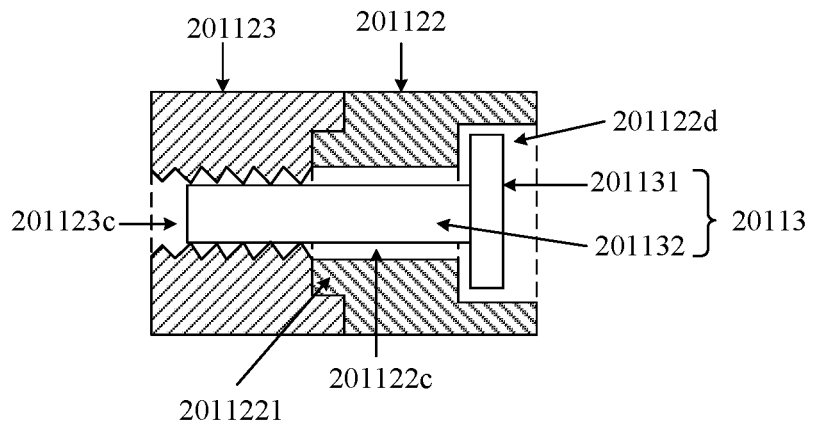
FIG. 6 is a schematic structural diagram of a first lug, a second lug, and a connecting member according to an embodiment of the present disclosure.

Optionally, referring to FIG. 6, the connecting member 20113 may be a first screw, and a thread is present inside the second through hole 201122c or the third through hole 201123c. The first screw 20113 is connected to one of the second and third through holes with the thread by passing through the other of the second through hole 201122c and the third through hole 201123c without the thread.

As an optional embodiment, referring to FIG. 6, assuming that the second through hole 201122c of the first lug 201122 does not include the thread, and the third through hole 201123c of the second lug 201123 includes the thread, the first screw 20113 may be connected to the third through hole 201123c of the second lug 201123 of the adjacent adjustment structure 2011 by passing through the side, distal from the second lug 201123, of the first lug 201122.

In addition, the diameter of the head 201131 of the first screw 20113 may be greater than the diameter of the second through hole 201122c of the first lug 201122, and the diameter of the connecting member 201132 of the first screw 20113 may be less than the diameter of the second through hole 201122c of the first lug 201122. The head 201131 of the first screw 20113 can press the first lug 201122 to the second lug 201123, such that the first lug 201122 is in close contact with the second lug 201123, such that the reliability of the connection between the adjacent adjustment structures 2011 is ensured.

Referring to FIG. 6, it can further be seen that the side, distal from the second lug 201123, of the first lug 201122 is provided with a groove 201122d, and the diameter of the groove 201122d is greater than the diameter of the head 201131 of the first screw 20113. Thus, the head 201131 of the first screw 20113 can be disposed in the groove 201122d, such that the first screw 20113 can be avoided loosening due to the influence of other structures, and the reliability of the connection between the first lug 201122 and the second lug 201123 of the adjacent adjustment structure 2011 can be ensured.

Figure 7:
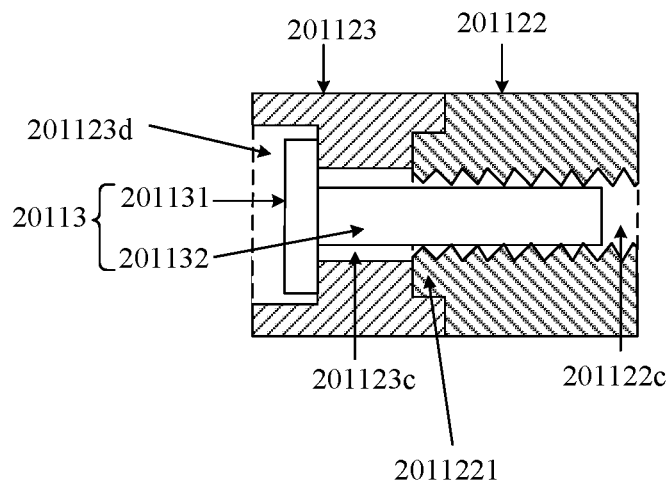
FIG. 7 is a schematic structural diagram of another first lug, another second lug, and another connecting member according to an embodiment of the present disclosure.

As another optional embodiment, referring to FIG. 7, assuming that the second through hole 201122c of the first lug 201122 includes the thread, and the third through hole 201123c of the second lug 201123 does not include the thread, the first screw 20113 can be connected to the second through hole 201122c of the first lug 201122 of the adjacent adjustment structure 2011 by passing through the side, distal from the first lug 201122, of the second lug 201123.

In addition, the diameter of the head 201131 of the first screw 20113 may be greater than the diameter of the third through hole 201123c of the second lug 201123, and the diameter of the connecting member 201132 of the first screw 20113 may be less than the diameter of the third through hole 201123c of the second lug 201123. The head 201131 of the first screw 20113 can press the second lug 201123 to the first lug 201122, such that the second lug 201123 is in close contact with the first lug 201122, and the reliability of the connection between the adjacent adjustment structures is ensured.

In addition, referring to FIG. 7, the side, distal from the first lug 201122, of the second lug 201123 is provided with a groove, and the diameter of the groove 201123d is greater than the diameter of the head 201131 of the first screw 20113. Thus, the head 201131 of the first screw 20113 can be disposed in the groove 201123d, such that the first screw 20113 can be avoided loosening due to the influence of other structures, and the reliability of the connection between the first lug 201123 and the second lug 201123 of the adjacent adjustment structure 2011 can be ensured.

In the embodiments of the present disclosure, as an optional embodiment, in combination with FIGS. 4 and 5, when the first lug 201122 is connected to the second lug 201123 of the adjacent adjustment structure 2011, the first side face 201122a of the first lug 201122 may be in contact with the first side face 201123a of the second lug 201123 of the adjacent adjustment structure 2011. In addition, referring to FIG. 5, the distance H between an axis of the first through hole 201121a in the body structure 201121 of the rotating member 20112 and an axis of the first through hole 201121a in the body structure 201121 of the adjacent rotating member 20112 is twice the distance h between the first through hole 201121a and the first side face.

Figure 8:
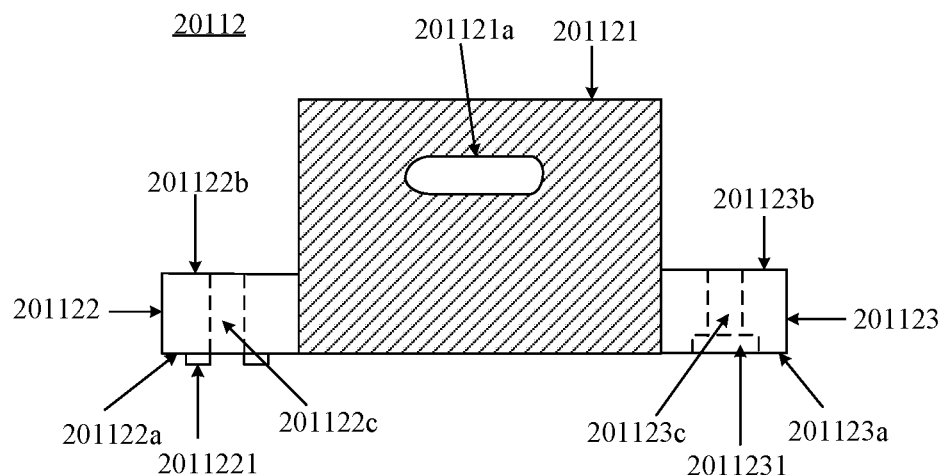
FIG. 8 is a schematic structural diagram of another rotating member according to an embodiment of the present disclosure.
Figure 9:
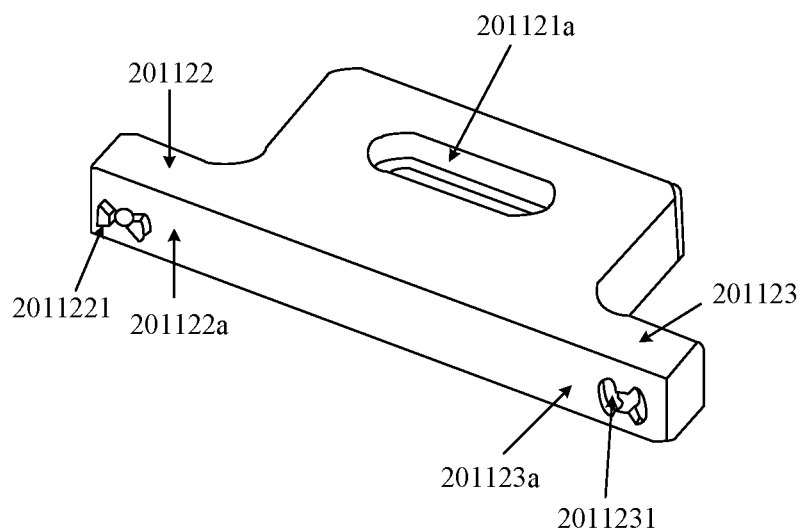
FIG. 9 is a schematic structural diagram of yet another rotating member according to an embodiment of the present disclosure.

Referring to FIGS. 8 and 9, in order to ensure the reliable connection between the first lug 201122 and the second lug 201123, the first side face 201122a of the first lug 201122 may be provided with a protrusive structure 2011221, and the first side face 201123a of the second lug 201123 may be provided with a groove 2011231. Referring to FIGS. 6 and 7, the protrusive structure 2011221 in the first lug 201122 may be configured to be connected to the groove 2011231 of the second lug 201123 of the adjacent adjustment structure 2011. That is, after the first lug 201122 is connected to the second lug 201123 of the adjacent adjustment structure 2011, the protrusive structure 2011221 in the first lug 201122 may be disposed in the groove 2011231 of the second lug 201123 of the adjacent adjustment structure 2011.

Figure 10:
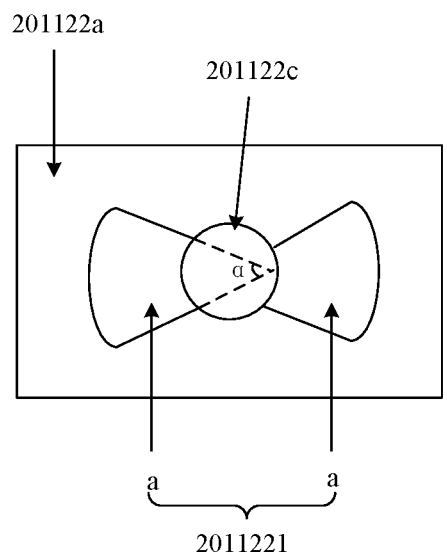
FIG. 10 is a schematic diagram of a first side face of a first lug according to an embodiment of the present disclosure.
Figure 11:
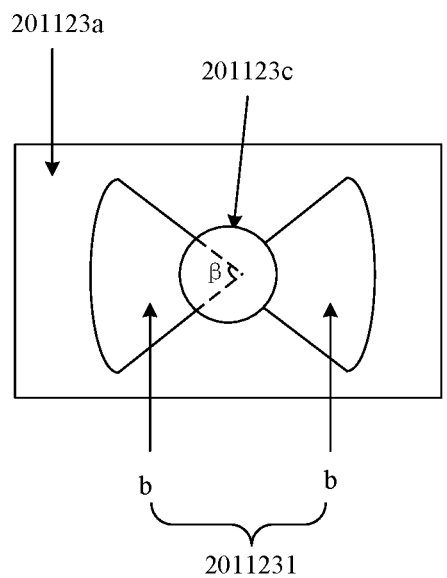
FIG. 11 is a schematic diagram of a first side face of a second lug according to an embodiment of the present disclosure.

FIG. 10 is a schematic diagram of a first side face of a first lug according to an embodiment of the present disclosure. Referring to FIG. 10, the protrusive structure 2011221 may include two protrusive sub-structures a disposed on two sides of the second through hole 201122c respectively. FIG. 11 is a schematic diagram of a first side face of a second lug according to an embodiment of the present disclosure. Referring to FIG. 11, the groove 2011231 may include two sub-grooves b disposed on two sides of the third through hole 201123c respectively. Each protrusive sub-structure a of the first lug 201122 may be configured to be connected to one sub-groove b of the second lug 201123 of the adjacent adjustment structure 2011. That is, each protrusive sub-structure a of the first lug 201122 may be disposed in one sub-groove b of the second lug 201123 of the adjacent adjustment structure 2011.

For the structure shown in FIG. 5, that is, in a case where the first side face 201122a of the first lug 201122 is in contact with the first side face 201123a of the second lug 201123 of the adjacent adjustment structure 2011, referring to FIG. 10, an orthographic projection of each protrusive sub-structure a on the first side face 201122a of the first lug 201122 may be fan-shaped. Referring to FIG. 11, an orthographic projection of each sub-groove b on the first side face 201123a of the second lug 201123 may be fan-shaped.

In addition, referring to FIGS. 10 and 11, as a first fan-shaped angle β of each sub-groove b may be larger than a second fan-shaped angle α of the protrusive sub-structure a, the position of the protrusive sub-structure a in the sub-groove b can be changed. Therefore, the angle between the rotating member 20112 and the rotating member 20112 of the adjacent adjustment structure 2011 can be changed, such that the curvature of the support apparatus 201 can be adjusted.

Figure 12:
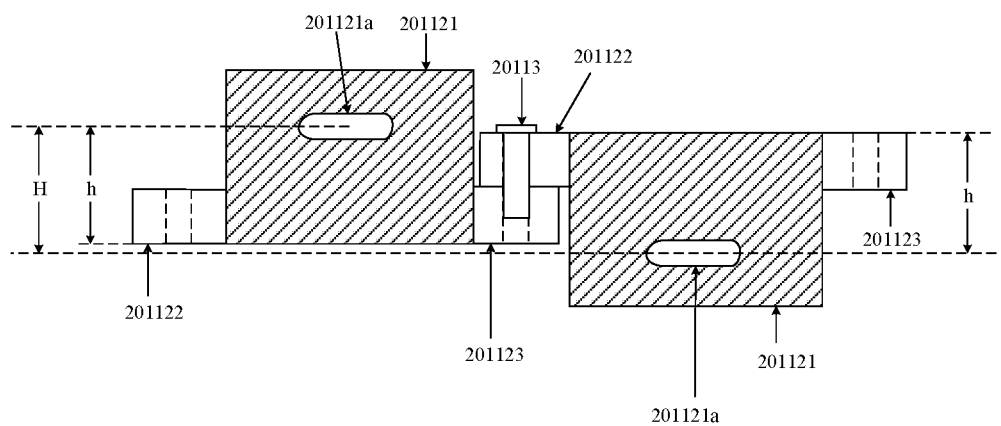
FIG. 12 is a schematic diagram of another connection relationship of adjacent adjustment structures according to an embodiment of the present disclosure.

As another optional embodiment, referring to FIG. 12, the second side face 201122b of the first lug 201122 may be in contact with the second side face 201123b of the second lug 201123 of the adjacent adjustment structure 2011. In addition, referring to FIG. 12, the distance between the axis of the first through hole 201121a in the body structure 201121 of the rotating member 20112 and the axis of the first through hole 201121a in the body structure 201121 of the adjacent rotating member 20112 is less than twice the distance between the first through hole 201121a and the first side face.

Figure 13:
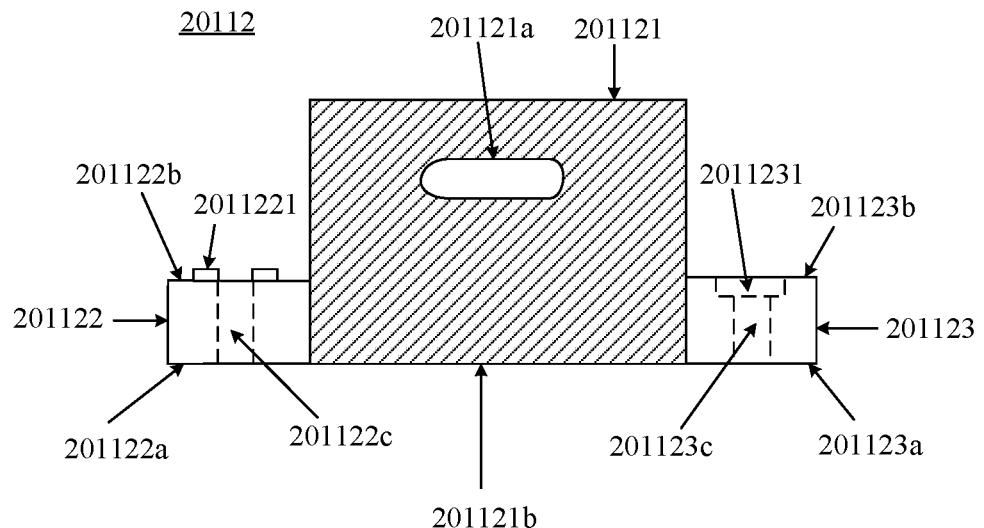
FIG. 13 is a schematic structural diagram of still another rotating member according to an embodiment of the present disclosure.

Referring to FIG. 13, in order to ensure the reliable connection between the first lug 201122 and the second lug 201123, the second side face 201122b of the first lug 201122 may be provided with a protrusive structure 2011221, and the second side face 201123b of the second lug 201123 may be provided with a groove 2011231. The protrusive structure 2011221 in the first lug 201122 may be configured to be connected to the groove 2011231 of the second lug 201123 of the adjacent adjustment structure 2011. That is, after the first lug 201122 is connected to the second lug 201123 of the adjacent adjustment structure 2011, the protrusive structure 2011221 in the first lug 201122 may be disposed in the groove 2011231 of the second lug 201123 of the adjacent adjustment structure 2011.

Figure 14:
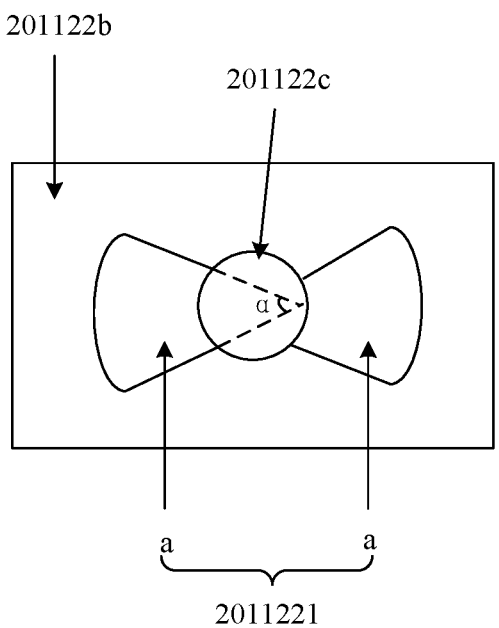
FIG. 14 is a schematic diagram of a second side face of a first lug according to an embodiment of the present disclosure.
Figure 15:
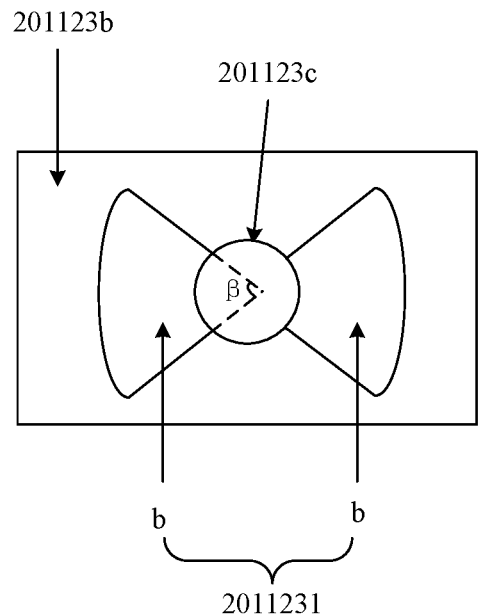
FIG. 15 is a schematic diagram of a second side face of a second lug according to an embodiment of the present disclosure.

FIG. 14 is a schematic diagram of a second side face of a first lug according to an embodiment of the present disclosure. Referring to FIG. 14, the protrusive structure 2011221 may include two protrusive sub-structures a disposed on two sides of the second through hole 201122c respectively. FIG. 15 is a schematic diagram of a second side face of a second lug according to an embodiment of the present disclosure. Referring to FIG. 15, the groove 2011231 may include two sub-grooves b disposed on two sides of the third through hole 201123c respectively. Each protrusive sub-structure a of the first lug 201122 may be configured to be connected to one sub-groove b of the second lug 201123 of the adjacent adjustment structure 2011. That is, each protrusive sub-structure a of the first lug 201122 may be disposed in one sub-groove b of the second lug 201123 of the adjacent adjustment structure 2011.

For the structure shown in FIG. 12, that is, in a case where the second side face 201122b of the first lug 201122 is in contact with the second side face 201123b of the second lug 201123 of the adjacent adjustment structure 2011, referring to FIG. 14, the orthographic projection of each protrusive sub-structure a on the second side face 201122b of the first lug 201122 may be fan-shaped, and the orthographic projection of each sub-groove b on the second side face 201123b of the second lug 201123 may be fan-shaped. In addition, the first fan-shaped angle β of each sub-groove b may be greater than the second fan-shaped angle α of the protrusive sub-structure a, such that the angle between the rotating member 20112 and the rotating member 20112 of the adjacent adjustment structure 2011 can be changed, and the curvature of the support apparatus 201 is further adjusted.

Figure 16:
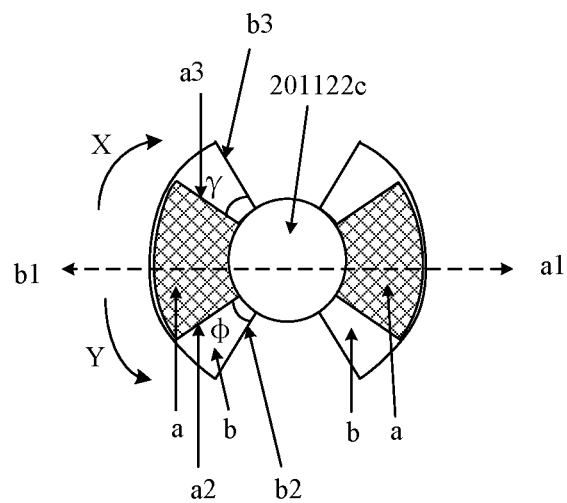
FIG. 16 is a schematic diagram of a connection relationship of a protrusive sub-structure and a sub-groove according to an embodiment of the present disclosure.
Figure 17:
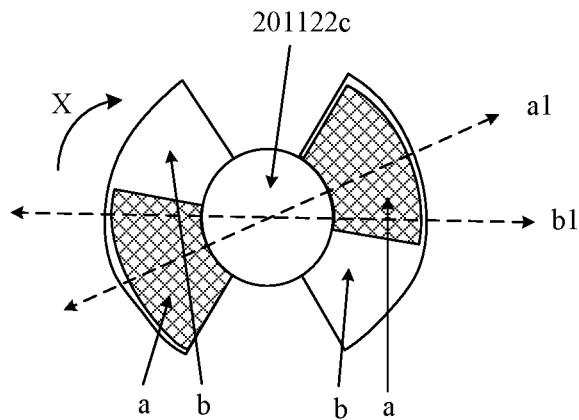
FIG. 17 is a schematic diagram of another connection relationship of a protrusive sub-structure and a sub-groove according to an embodiment of the present disclosure.
Figure 18:
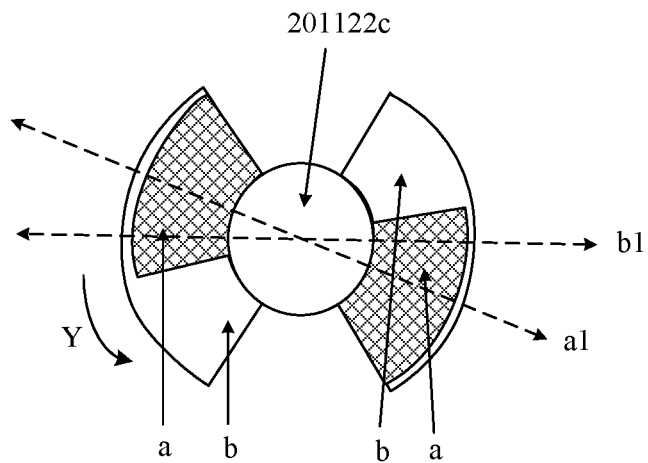
FIG. 18 is a schematic diagram of still another connection relationship of a protrusive sub-structure and a sub-groove according to an embodiment of the present disclosure.

Referring to FIG. 16, in the case that each adjustment structure 2011 is connected to the adjacent adjustment structure 2011, and the axis a1 of the protrusive sub-structure a and the axis b1 of the sub-groove b are collinear, the curvature of the support apparatus 201 is the smallest within the curvature adjustable range, and the minimum curvature of the support apparatus 201 may be 0. Referring to FIGS. 17 and 18, in the case that each adjustment structure 2011 is connected to the adjacent adjustment structure 2011, the axis a1 of the protrusive sub-structure a and the axis b1 of the sub-groove b are not collinear, and an end face of the protrusive sub-structure a is in contact with an end face of the groove d, the curvature of the support apparatus 201 is the largest within the curvature adjustable range. The maximum curvature of the support apparatus 201 is determined based on a curvature of the bendable structure under the maximum bending degree without damage. The maximum bending degree of the bendable structure depends on the characteristics of the bendable structure.

Referring to FIG. 16, in the case that each adjustment structure 2011 is connected to the adjacent adjustment structure 2011, and the axis a1 of the protrusive sub-structure a and the axis b1 of the sub-groove n are collinear, an included angle φ between a first face a2 of the protrusive sub-structure a and a first face b2 of the sub-groove b may be equal to an included angle γ between a second face a3 of the protrusive sub-structure a and a second face b3 of the sub-groove b. In this case, the protrusive sub-structure a can be rotated along the first direction X or the second direction Y relative to the sub-groove b. The first direction X is opposite to the second direction Y, and the first direction X and the second direction Y are parallel to the first side face 201122a of the first lug 201122.

In combination with FIGS. 16 to 18, as the first face a2 of the protrusive sub-structure a is in contact with the first face b2 of the sub-groove b in FIG. 17, the protrusive sub-structure a can be rotated along the first direction X relative to the sub-groove b. As the second face a3 of the protrusive sub-structure a is in contact with the second face b3 of the sub-groove b in FIG. 18, the protrusive sub-structure a can be rotated along the second direction Y relative to the sub-groove b.

It is noted that the roughness of the side, in contact with another lug, of each lug may be greater than a roughness threshold. By setting the side, in contact with another lug, of each lug with greater roughness, the relative movement of the two lugs caused by a reverse elastic force of the bendable structure can be avoided, such that the stability of the support apparatus 201 composed of the plurality of adjustment structures 2011 can be ensured.

Optionally, in the process of manufacturing the adjustment structure 2011, the contact face of the lug in the adjustment structure 2011 may be treated as a frosted face by a sand blasting process or an oxidation process, so as to increase the roughness of the contact face of the lug.

For the structures shown in FIGS. 5, 8 and 9, as the first side face 201122a of the first lug 201122 is in contact with the first side face 201123a of the second lug 201123 of the adjacent adjustment structure 2011, the roughness between the first side face 201122a of the first lug 201122 and the first side face 201123a of the second lug 201123 of the adjacent adjustment structure 2011 may be greater. For the structures shown in FIGS. 12 and 13, as the second side face 201122b of the first lug 201122 is in contact with the second side face 201123b of the second lug 201123 of the adjacent adjustment structure 2011, the roughness between the second side face 201122b of the first lug 201122 and the second side face 201123b of the second lug 201123 of the adjacent adjustment structure 2011 may be set greater.

In the embodiments of the present disclosure, the body structure 201121, the first lug 201122, and the second lug 201123 may be integrally formed. That is, the body structure 201121, the first lug 201122, and the second lug 201123 may be manufactured by the same one-time manufacturing process. For example, the body structure 201121, the first lug 201122, and the second lug 201123 are manufactured by the same mold.

Referring to FIGS. 4 and 13, the first side face 201122a of the first lug 201122, the first side face 201123a of the second lug 201123, and the first side face 201121b of the body structure 201121 may be coplanar. The first side face 201122a of the first lug 201122 and the first side face 201123a of the second lug 201123 may be coplanar; and the first side face 201122a of the first lug 201122 and the first side face 201123a of the second lug 201123 may be not coplanar with the first side face of the body structure 201121.

After the curvature of the support apparatus 201 changes, in the plurality of adjustment structures 2011 of the support apparatus 201, the distance between the axis of the first through hole 201121a in each adjustment structure 2011 and the axis of the first through hole 201121a of the adjacent adjustment structure 2011 may be changed. Therefore, referring to FIGS. 4, 5, 8, 9, 12 and 13, the first through hole 201121a in the body structure 201121 may be a strip-shaped through hole, which facilitates the adjustment of the curvature of the support apparatus 201.

In the case that the curvature of the support apparatus 201 is greater, the bending degree of the support apparatus 201 is greater, and the distance between the axes of the first through holes 201121a of the adjacent adjustment structures 2011 of the support apparatus 201 is greater. In the case that the curvature of the support apparatus 201 is less, the bending degree of the support apparatus 201 is less, and the distance between the axes of the first through holes 201121a of the adjacent adjustment structures 2011 of the support apparatus 201 is less.

Optionally, the minimum curvature of the support apparatus 201 may be 0. That is, a line between the axes of the first through holes 201121a of the adjacent adjustment structures 2011 of the support apparatus 201 is a straight line. In addition, in the case that the curvature of the support apparatus 201 is 0, the distance between the axes of the first through holes 201121a of the adjacent adjustment structures 2011 of the support apparatus 201 is smallest.

Figure 19:
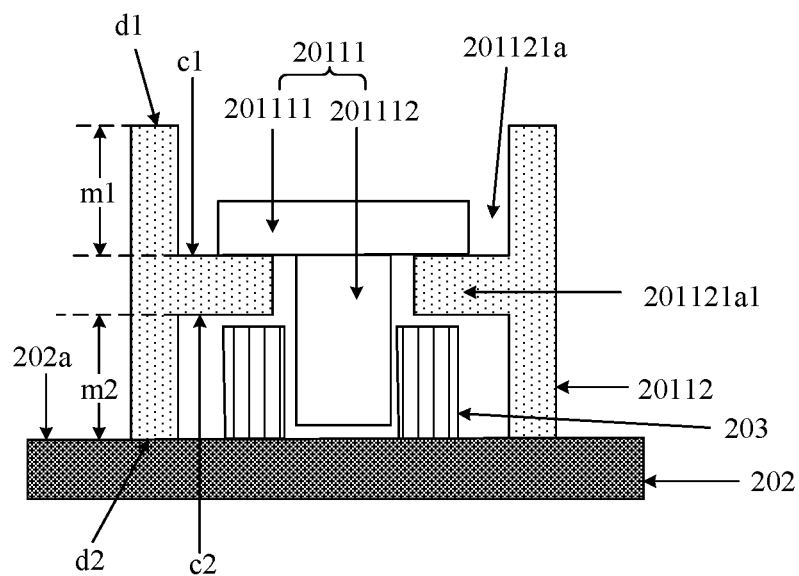
FIG. 19 is a schematic diagram of a connection relationship of a fixing member and a rotating member according to an embodiment of the present disclosure.

In the embodiments of the present disclosure, referring to FIG. 19, the fixing member 20111 may be a second screw. A ring-shaped first boss 201121a1 may be disposed inside the first through hole 201121a, and the diameter of the head 201111 of the second screw 20111 may be greater than the inner diameter of the first boss 201121a1 and less than the inner diameter of the first through hole 201121a.

In addition, the side, proximal to the connecting member 201112 of the second screw 20111, of the head 201111 of the second screw 20111 may be in contact with the first face c1 of the first boss 201121a1. After the rotating member 20112 is fixedly connected to the bendable structure 202 by the second screw 20111, the first face c1 of the first boss 201121a1 is farther away from the back side of the bendable structure 202 relative to the second face c2 of the first boss 201121a1. The first face c1 of the first boss 201121a1 may be parallel to the second face c2 of the first boss 201121a1.

In the embodiments of the present disclosure, referring to FIG. 19, the distance m1 between the first face c1 of the first boss 201121a1 and the first end surface d1 of the body structure 201121 may be equal to the distance m2 between the second face c2 of the first boss 201121a1 and the second end surface d2 of the body structure 201121. The first end face d1 of the body structure 201121 may be parallel to the second end face d2 of the body structure 201121, and the second end face d2 is a face connected to the back side of the bendable structure 202.

The distance between the first face c1 of the first boss 201121a1 and the first end face d1 of the body structure 201121 may also be not equal to the distance between the second face c2 of the first boss 201121a1 and the second end face d2 of the body structure 201121, which is not limited in the embodiments of the present disclosure.

Referring to FIG. 19, the connecting member 201112 of the second screw 20111 may be shorter than the distance between the first face c1 of the first boss 201121a1 and the second end face d2 of the body structure 201121, such that the bendable structure 202 is prevented from being damaged caused by the fact that the connecting member 201112 of the second screw 20111 abuts against the back side of the bendable structure 202.

In addition, in order to ensure the reliability of supporting the bendable structure by the support apparatus, the distances between the end faces, distal from the back side of the bendable structure, of the adjustment structures 2011 in the support apparatus 201 and the back side of the bendable structure are equal. For example, in the case that the curvature of the support apparatus 201 is 0, the first end faces d1 of the adjustment structures 2011 in the support apparatus 201 are coplanar, and the second end faces d2 of the adjustment structures 2011 are coplanar.

In the embodiments of the present disclosure, as the roughness between the side, in contact with the first boss 201121a1, of the head 201111 of the second screw 20111 is greater than the roughness threshold, the relative movement between the second screw 20111 and the first boss 201121a1 can be avoided after the rotating member 20112 is fixedly connected to the bendable structure 202 by the second screw 20111. Thus, the reliability of the support apparatus 201 is ensured.

Optionally, the roughness of the side, proximal to the connecting member 201112 of the second screw 20111, of the head 201111 of the second screw 20111 may be greater, and the roughness of the first face c1, in contact with the head 201111 of the second screw 20111, of the first boss 201121a1 may be greater.

In summary, the support apparatus is provided in the embodiments of the present disclosure. The apparatus includes the plurality of adjustment structures that are sequentially connected. Each of the plurality of adjustment structures is connected to the back side of the bendable structure, and the any two adjacent adjustment structures are rotatable relative to each other. Therefore, the curvature of the support apparatus can be adjusted by adjusting the rotation angle between each adjustment structure and the adjacent adjustment structure, and the curvature of the bendable structure connected to the support apparatus can be further adjusted, such that the use flexibility of the bendable structure is relatively great.

Figure 20:
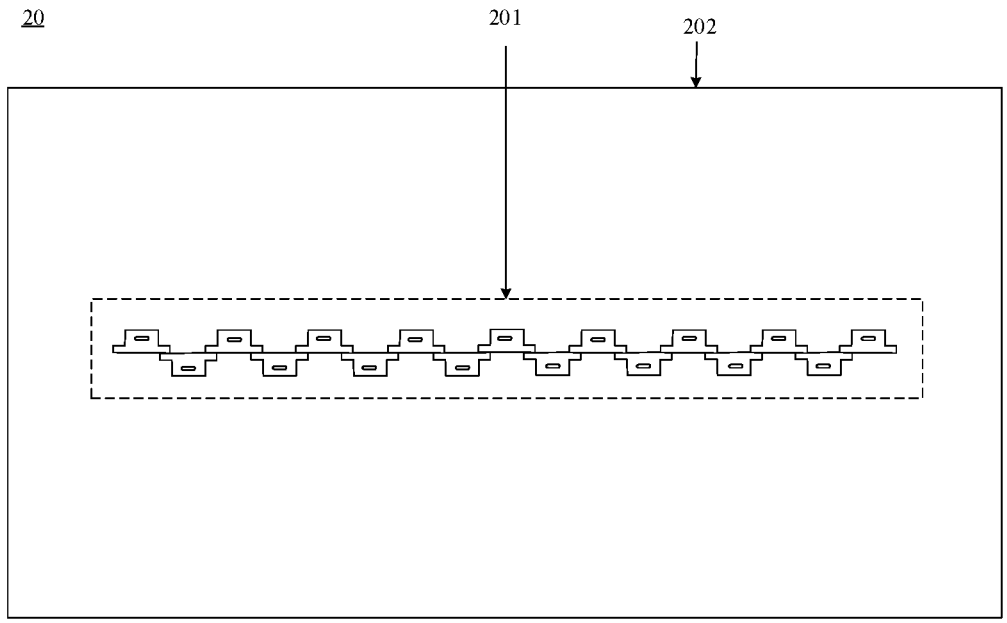
FIG. 20 is a schematic structural diagram of a bendable apparatus according to an embodiment of the present disclosure.

FIG. 20 is a schematic structural diagram of a bendable apparatus according to an embodiment of the present disclosure. Referring to FIG. 20, the bendable apparatus 20 may include a bendable structure 202 and at least one support apparatus 201 as provided in the above embodiments. For example, one support apparatus 201 is shown in FIG. 20.

The support apparatus 201 may be disposed on a back side of the bendable structure 202, and is connected to the back side of the bendable structure 202. In addition, as the curvature of the support apparatus 201 is adjustable, the curvature of the bendable structure 202 is also adjustable. That is, the curvature of the bendable structure 202 is not fixed. Thus, the use flexibility of the bendable structure 202 is relatively great.

Optionally, the bendable structure 202 may be a flexible display panel. Accordingly, the bendable apparatus 20 may be a display apparatus. The bendable structure 202 may further be another bendable structure, which is not limited in the embodiments of the present disclosure.

Figure 21:
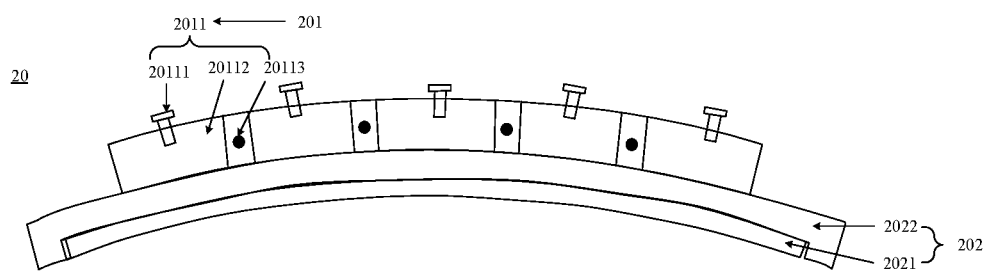
FIG. 21 is a schematic structural diagram of another bendable apparatus according to an embodiment of the present disclosure.

Referring to FIG. 21, the flexible display panel 202 may include a flexible display screen 2021 and a flexible backplane 2022. The flexible backplane 2022 may be disposed on a non-display side of the flexible display screen 2021, and the flexible backplane 2022 may be fixedly connected to the flexible display screen 2021. The support apparatus 201 may be disposed on a side, distal from the flexible display screen 2021, of the flexible backplane 2022, and the support apparatus 201 may be fixedly connected to the flexible backplane 2022. In addition, referring to FIG. 21, the fixing member 20111 in the support apparatus 201 may point to the center of the curved surface of the bended flexible display panel.

Figure 22:
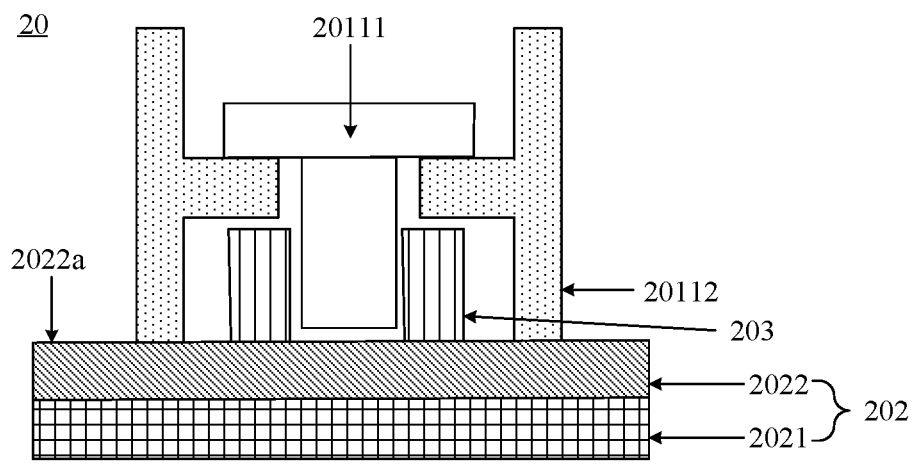
FIG. 22 is a schematic structural diagram of yet another bendable apparatus according to an embodiment of the present disclosure.

Referring to FIGS. 19 and 22, the bendable apparatus 20 may further include a plurality of ring-shaped second bosses 203 disposed on a side, distal from the flexible display screen 2021, of the flexible backplane 2022, and a thread may be present inside each second boss 203. The fixing member 20111 in the support apparatus 20 may be in threaded connection with one second boss 203, so as to fixedly connect the rotating member 20112 in the support apparatus 20 to the flexible backplane 2022.

Figure 23:
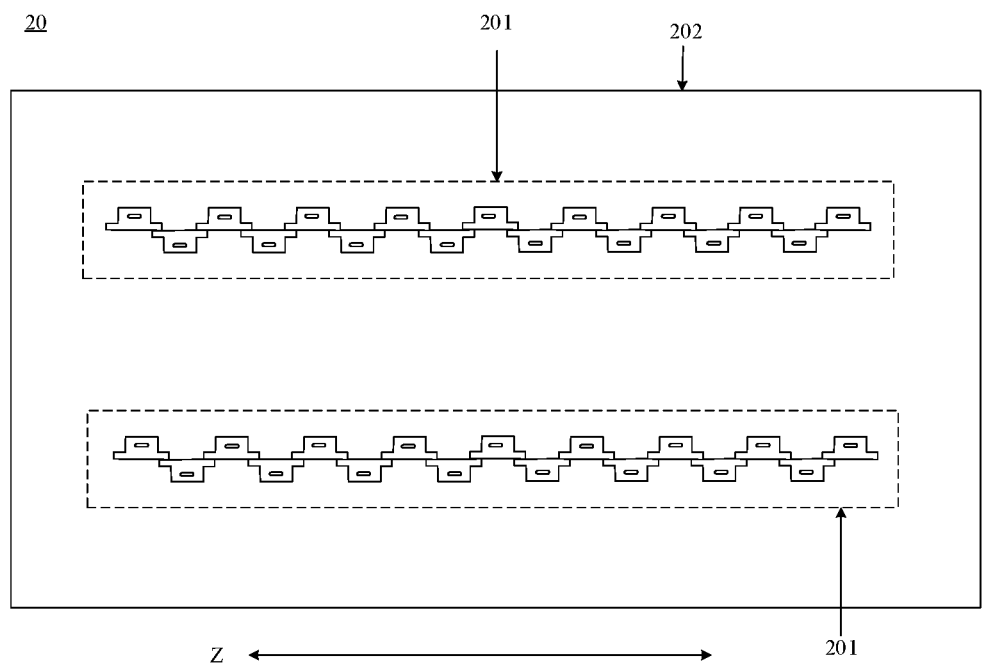
FIG. 23 is a structural diagram of still another bendable apparatus according to an embodiment of the present disclosure.

In the embodiments of the present disclosure, referring to FIG. 23, the bendable apparatus 20 may include a plurality of support apparatuses 201. For example, two support apparatuses 201 are shown in FIG. 23. As each of the support apparatuses 201 can support the bendable structure 202 and apply a force to the bendable structure 201, the reliability of supporting the bendable structure 202 can be ensured. In addition, bending degrees of all the portions of the bendable structure 201 can be the same, and the quality of the bendable apparatus 20 is ensured.

The plurality of adjustment structures 2011 in each support apparatus 201 may be arranged along a target direction. Thus, directions of the forces applied by the support apparatuses 201 to the bendable structure 202 can be the same, such that the bendable structure 202 can be bent towards one direction.

Illustratively, where the bendable structure 202 is a flexible display panel, the target direction Z may be a row direction of pixels in the flexible display panel 202.

Optionally, the display apparatus may be an electronic paper, an organic light-emitting diode (OLED) display apparatus, an active-matrix organic light-emitting diode (AMOLED) display apparatus, a mobile phone, a tablet computer, a TV, a display, a notebook computer, a digital photo frame, a navigator or any other product or member having a display function.

It should be noted that when the bendable structure 202 is supported by the support apparatus 201 in the embodiments of the present disclosure, the user may first place the support apparatus 201 (in this case, the connecting member 20113 is not fully tightened, and the adjacent adjustment structures 2011 are rotatable relative to each other) on the back side of the bendable structure 202, and the rotating member 20112 is pre-fixed by the fixing member 20111 (in this case, the fixing member 20111 is not fully tightened). Then, after adjusting the angles between the adjustment structures 2011, the user tightens the connecting member 20113 to fix the curvature of the support apparatus 201 (in this case, the curvature of the bendable structure 202 may be equal to the curvature of the support apparatus 201). Eventually, the fixing member 20111 is tightened, such that the rotating member 20112 is fixedly connected to the bendable structure 202. Therefore, the support apparatus 201 can support the bendable structure 202, and the curvature of the bendable structure 202 can be fixed.

In summary, the bendable apparatus is provided in the embodiments of the present disclosure. The bendable apparatus includes the bendable structure and at least one support apparatus. The support apparatus includes the plurality of adjustment structures that are sequentially connected, each of the plurality of adjustment structures is connected to the back side of the bendable structure, and the any two adjacent adjustment structures are rotatable relative to each other. Therefore, the curvature of the support apparatus can be adjusted by adjusting the rotation angle between each adjustment structure and the adjacent adjustment structure, and the curvature of the bendable structure connected to the support apparatus can be further adjusted, such that the use flexibility of the bendable structure is relatively great.

Described above are merely optional embodiments of the present disclosure, but are not intended to limit the present disclosure. Any modifications, equivalent replacements, improvements and the like made within the spirit and principles of the present disclosure should be included within the scope of protection of the present disclosure.

What is claimed is:

1. A support apparatus, disposed on a back side of a bendable structure, comprising:
    a plurality of adjustment structures that are sequentially connected, wherein each of the plurality of adjustment structures is configured to be connected to the back side of the bendable structure, and any two adjacent adjustment structures of the plurality of adjustment structures are rotatable relative to each other,
    wherein each of the adjustment structures comprises a fixing member and a rotating member; wherein
    the fixing member is connected to the rotating member, and is configured to fixedly connect the rotating member to the bendable structure; and
    the rotating member is rotatably connected to the rotating member of an adjacent adjustment structure, wherein the rotating member comprises a body structure, and a first lug and a second lug that are disposed on two sides of the body structure respectively; wherein the body structure is provided with a first through hole, the fixing member being fixedly connected to the bendable structure by passing through the first through hole; and the first lug is rotatably connected to a second lug of the adjacent adjustment structure, wherein each of the first lug and the second lug comprises a first side face and a second side face that are opposite to each other; wherein the second side face is closer to the first through hole relative to the first side face, and both the first side face and the second side face are parallel to an axial direction of the first through hole; and the first side face of the first lug is in contact with a first side face of the second lug of the adjacent adjustment structure, or the second side face of the first lug is in contact with a second side face of the second lug of the adjacent adjustment structure.

2. The support apparatus according to claim 1, wherein the any two adjacent adjustment structures are rotatable relative to each other in a plane perpendicular to the back side of the bendable structure.

3. The support apparatus according to claim 1, wherein a roughness of a side, in contact with another lug, of each of the lugs is greater than a roughness threshold.

4. The support apparatus according to claim 1, wherein the first lug is provided with a second through hole, and the second lug is provided with a third through hole; and each of the adjustment structures further comprises a connecting member;

wherein the connecting member is disposed in the second through hole of the first lug, and the third through hole of the second lug of the adjacent adjustment structure, and the first lug is connected to the second lug of the adjacent adjustment structure by the connecting member; and an extension direction of the second through hole is perpendicular to the first side face of the first lug, and an extension direction of the third through hole is perpendicular to the first side face of the second lug.

5. The support apparatus according to claim 4, wherein the connecting member is a first screw; and a thread is present inside the second through hole or the third through hole;

wherein the first screw is connected to one of the second and third through holes with the thread by passing through the other of the second and third through hole without the thread;

or the second side face of the first lug is in contact with a second side face of the second lug of the adjacent adjustment structure; and the second side face of the first lug is provided with a protrusive structure, and the second side face of the second lug is provided with a groove; wherein the protrusive structure in the first lug is configured to be connected to the groove of the second lug of the adjacent adjustment structure.

6. The support apparatus according to claim 4, wherein the first side face of the first lug is in contact with the first side face of the second lug of the adjacent adjustment structure; and the first side face of the first lug is provided with a protrusive structure, and the first side face of the second lug is provided with a groove; wherein the protrusive structure in the first lug is configured to be connected to the groove of the second lug of the adjacent adjustment structure.

7. The support apparatus according to claim 6, wherein the protrusive structure comprises two protrusive sub-structures disposed on two sides of the second through hole respectively, and the groove comprises two sub-grooves disposed on two sides of the third through hole respectively;

wherein each of the protrusive sub-structures of the first lug is configured to be connected to one sub-groove of the second lug of the adjacent adjustment structure.

8. The support apparatus according to claim 7, wherein an orthographic projection of each of the protrusive sub-structures on the first side face of the first lug is fan-shaped, and an orthographic projection of each of the sub-grooves on the first side face of the second lug is fan-shaped; wherein a first fan-shaped angle of each of the sub-grooves is greater than a second fan-shaped angle of each of the protrusive sub-structures.

9. The support apparatus according to claim 1, wherein the body structure, the first lug, and the second lug are integrally formed.

10. The support apparatus according to claim 1, wherein a first side face of the first lug, a first side face of the second lug, and a first side face of the body structure are coplanar.

11. The support apparatus according to claim 1, wherein the first through hole is a strip-shaped through hole.

12. The support apparatus according to claim 11, wherein the fixing member is a second screw; and a ring-shaped first boss is disposed inside the first through hole; wherein a diameter of a head of the second screw is greater than an inner diameter of the first boss, and is less than an inner diameter of the first through hole.

13. The support apparatus according to claim 12, wherein a distance between a first face of the first boss and a first end face of the body structure is equal to a distance between a second face of the first boss and a second end face of the body structure; and the first face and the second face of the first boss are parallel to each other, the first end face and the second end face of the body structure are parallel to each other, and the second end face is a face connected to the back side of the bendable structure.

14. A bendable apparatus, comprising a bendable structure and at least one support apparatus comprising: a plurality of adjustment structures that are sequentially connected;

wherein the support apparatus is disposed on a back side of the bendable structure, and is connected to the back side of the bendable structure, and any two adjacent adjustment structures of the plurality of adjustment structures are rotatable relative to each other, wherein each of the adjustment structures comprises a fixing member and a rotating member; wherein the fixing member is connected to the rotating member, and is configured to fixedly connect the rotating member to the bendable structure; and the rotating member is rotatably connected to the rotating member of an adjacent adjustment structure, wherein the rotating member comprises a body structure, and a first lug and a second lug that are disposed on two sides of the body structure respectively; wherein the body structure is provided with a first through hole, the fixing member being fixedly connected to the bendable structure by passing through the first through hole; and the first lug is rotatably connected to a second lug of the adjacent adjustment structure, wherein each of the first lug and the second lug comprises a first side face and a second side face that are opposite to each other; wherein the second side face is closer to the first through hole relative to the first side face, and both the first side face and the second side face are parallel to an axial direction of the first through hole; and the first side face of the first lug is in contact with a first side face of the second lug of the adjacent adjustment structure, or the second side face of the first lug is in contact with a second side face of the second lug of the adjacent adjustment structure.

15. The bendable apparatus according to claim 14, wherein the bendable structure is a flexible display panel; or the bendable apparatus further comprises: a plurality of support apparatuses; wherein a plurality of adjustment structures in each of the plurality of support apparatuses are arranged along a target direction.

16. The bendable apparatus according to claim 15, wherein the flexible display panel comprises a flexible display screen and a flexible backplane; wherein the flexible backplane is disposed on a non-display side of the flexible display screen, and is fixedly connected to the flexible display screen; and the support apparatus is disposed on a side, distal from the flexible display screen, of the flexible backplane, and is fixedly connected to the flexible backplane.

17. The bendable apparatus according to claim 16, further comprising: a plurality of ring-shaped second bosses disposed on the side, distal from the flexible display screen, of the flexible backplane; wherein a thread is present inside each second boss; wherein the fixing member in the support apparatus is in threaded connection with one of the second bosses.

\* \* \* \* \*